United States Patent
Shiv

(10) Patent No.: US 9,983,231 B2
(45) Date of Patent: May 29, 2018

(54) DEEP-ETCHED MULTIPOINT PROBE

(71) Applicant: CAPRES A/S, Lyngby (DK)

(72) Inventor: Lior Shiv, Hillerod (DK)

(73) Assignee: CAPRES A/S, Lyngby (DK)

( * ) Notice: Subject to any disclaimer, the term of this patent is extended or adjusted under 35 U.S.C. 154(b) by 552 days.

(21) Appl. No.: 14/409,189

(22) PCT Filed: Jun. 20, 2013

(86) PCT No.: PCT/EP2013/062830
§ 371 (c)(1),
(2) Date: Dec. 18, 2014

(87) PCT Pub. No.: WO2013/190025
PCT Pub. Date: Dec. 27, 2013

(65) Prior Publication Data
US 2015/0177278 A1 Jun. 25, 2015

(30) Foreign Application Priority Data
Jun. 20, 2012 (EP) ..................................... 12172740

(51) Int. Cl.
*G01R 1/073* (2006.01)
*G01R 3/00* (2006.01)
*H05K 3/00* (2006.01)

(52) U.S. Cl.
CPC ......... *G01R 1/073* (2013.01); *G01R 1/07307* (2013.01); *G01R 3/00* (2013.01); *H05K 3/007* (2013.01)

(58) Field of Classification Search
None
See application file for complete search history.

(56) References Cited

U.S. PATENT DOCUMENTS 5,061,894 A * 10/1991 Ikeda ................... G01R 1/0735
324/72.5
6,281,691 B1 8/2001 Matsunaga et al.
(Continued)

FOREIGN PATENT DOCUMENTS

| EP | 2012131 | 1/2009 |
| WO | WO 86/06495 | 11/1986 |

OTHER PUBLICATIONS

International Search Report on corresponding PCT application (PCT/EP2013/062830) from International Searching Authority (EPO) dated Sep. 9, 2013.

*Primary Examiner* — Paresh Patel
(74) *Attorney, Agent, or Firm* — Klein, O'Neill & Singh, LLP

(57) ABSTRACT

A multipoint probe for establishing an electrical connection between a test apparatus and a test sample, the multipoint probe comprising a base defining a top surface and a plurality of traces provided on the top surface, each trace individually interconnecting a contact pad and a contact electrode for establishing the electrical connection to the test sample, each trace comprising a wide portion connected to the contact pad and a narrow portion connected to the contact electrode; the first top surface comprising first intermediate surfaces, each interconnecting a pair of neighboring traces at their respective wide portions, and second intermediate surfaces, each interconnecting a pair of neighboring traces at their respective narrow portions, and the first intermediate surfaces being provided on a first level and the second intermediate surfaces being provided on a second level above the first level relative to the base.

9 Claims, 11 Drawing Sheets

(56) References Cited

U.S. PATENT DOCUMENTS 7,064,072 B1 * 6/2006 Ting ................ H01L 21/76232
257/E21.549
2002/0153909 A1 10/2002 Petersen et al.
2006/0071677 A1 4/2006 Feigenbaum et al.

* cited by examiner

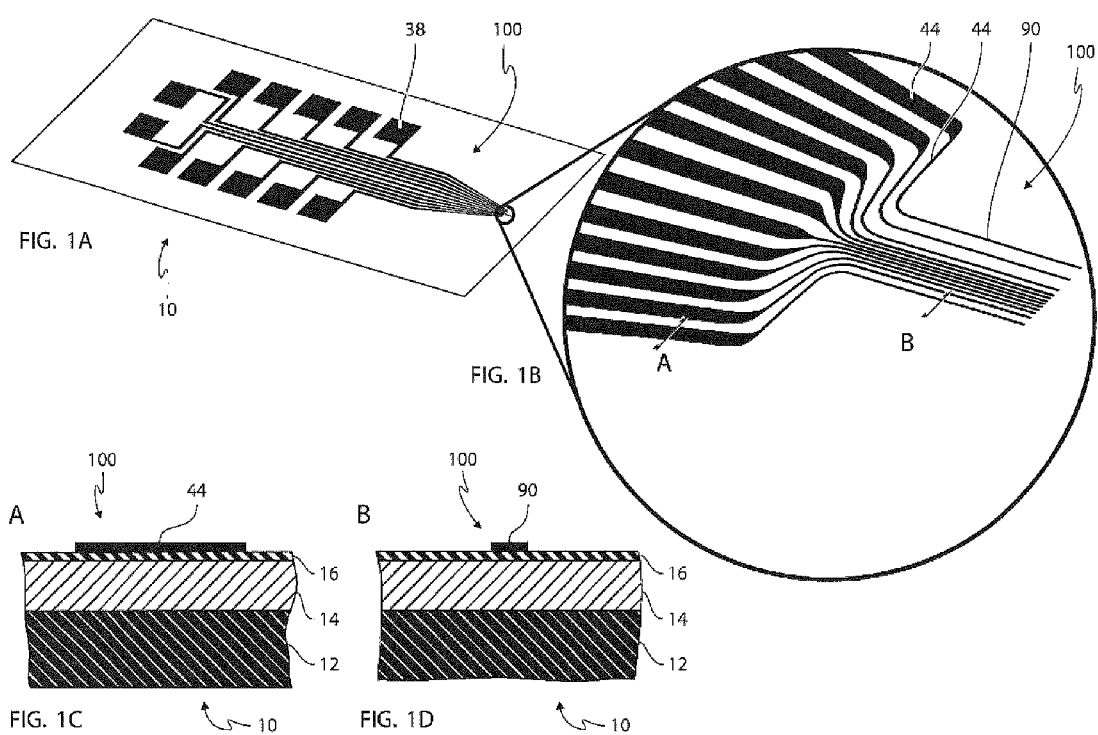

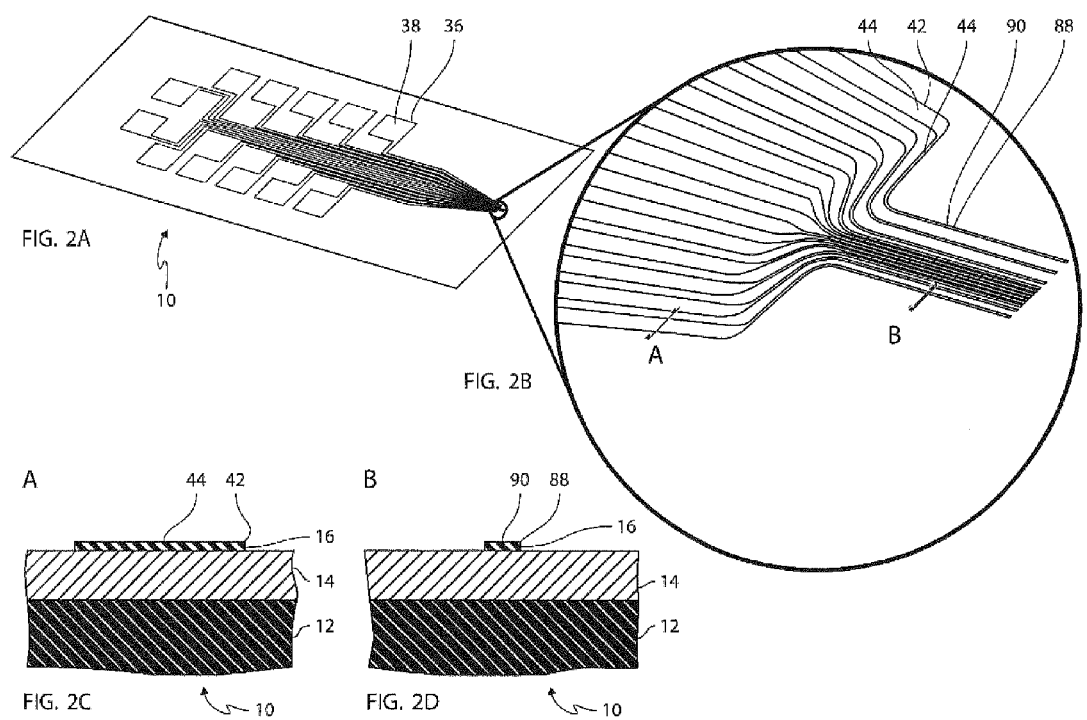

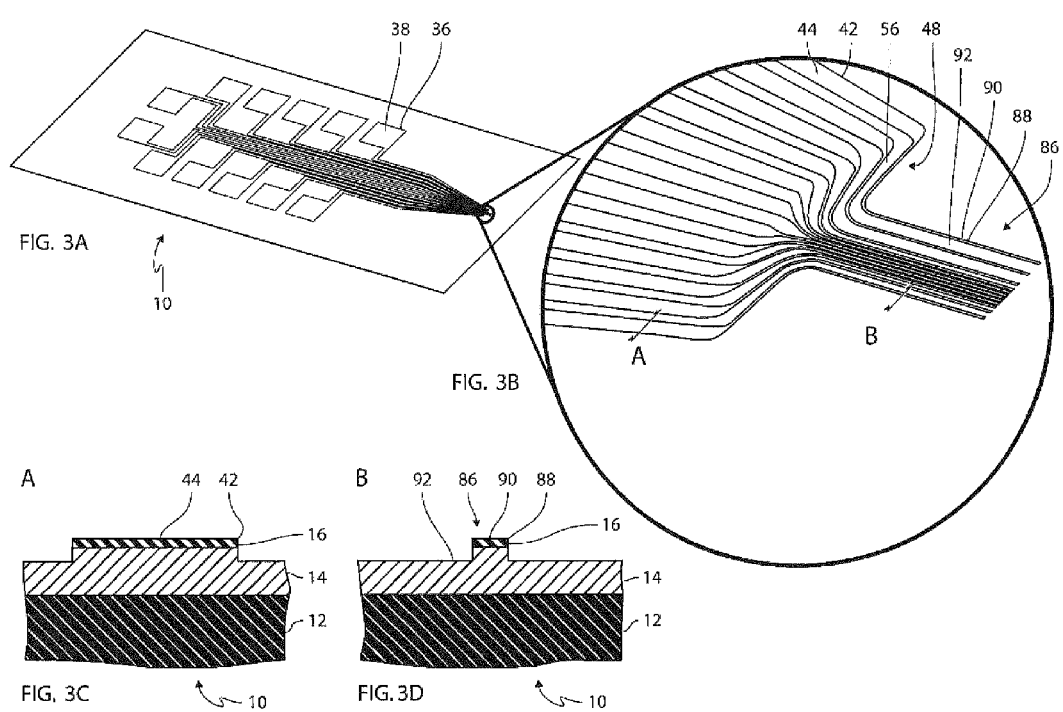

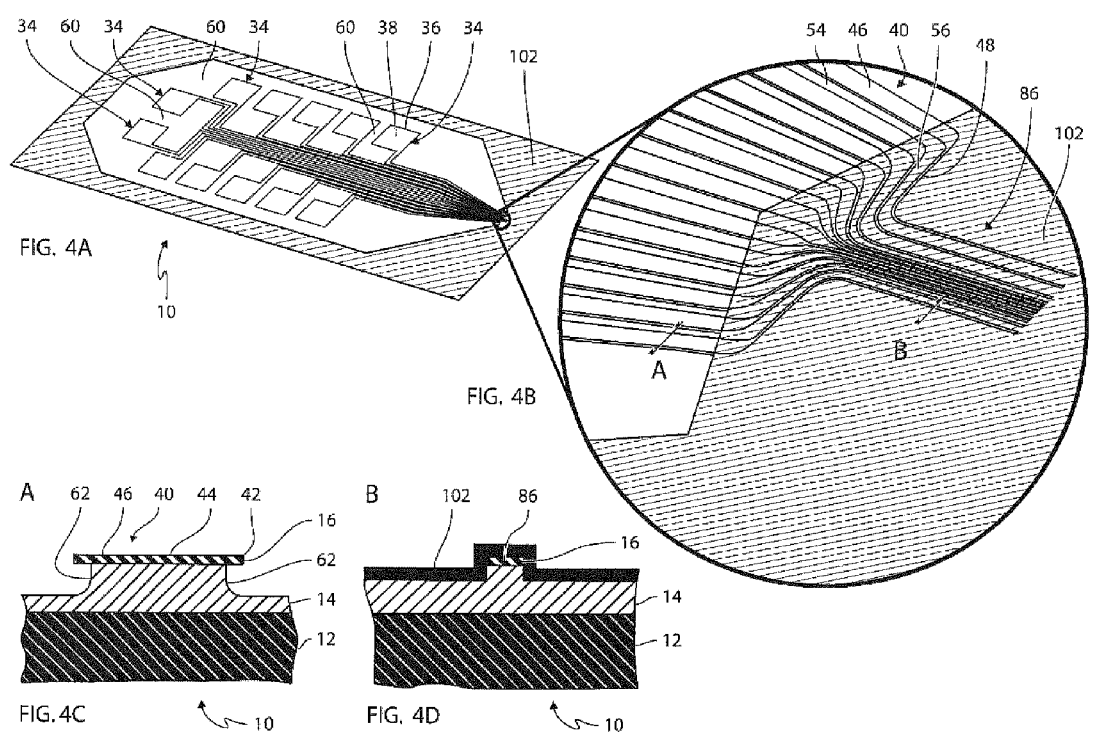

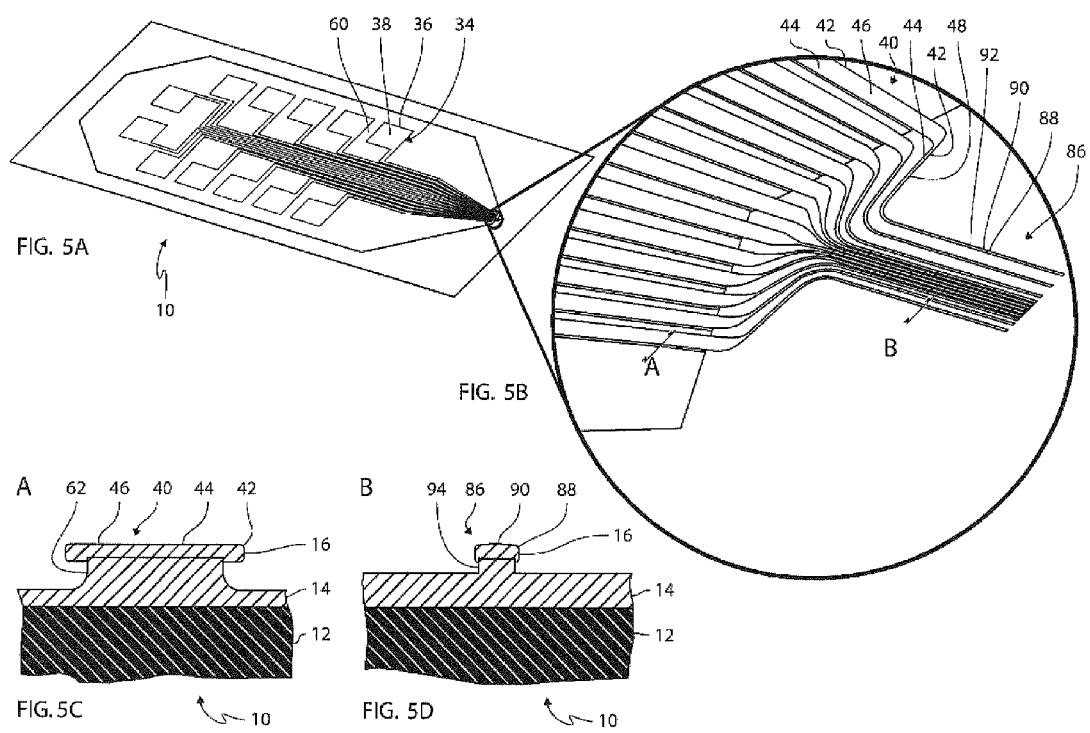

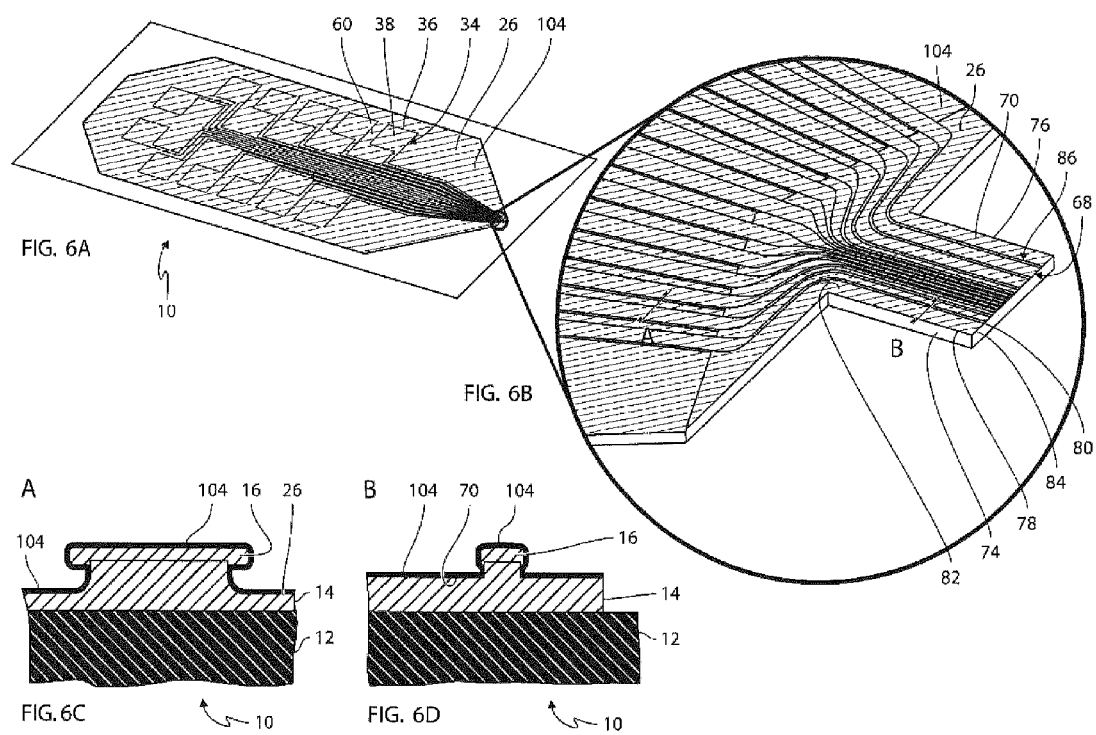

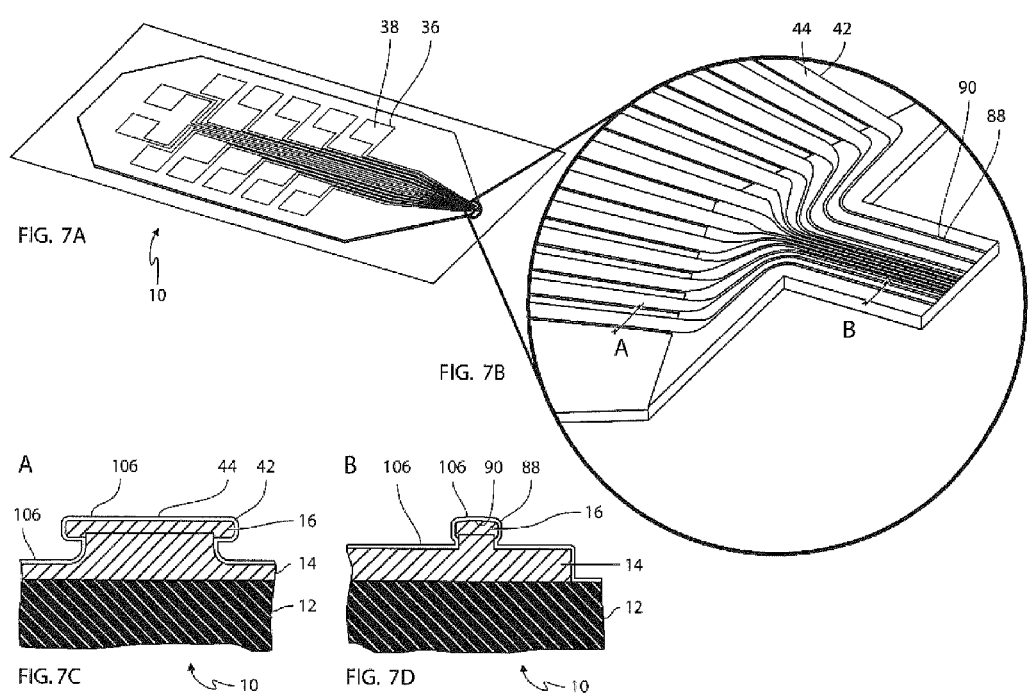

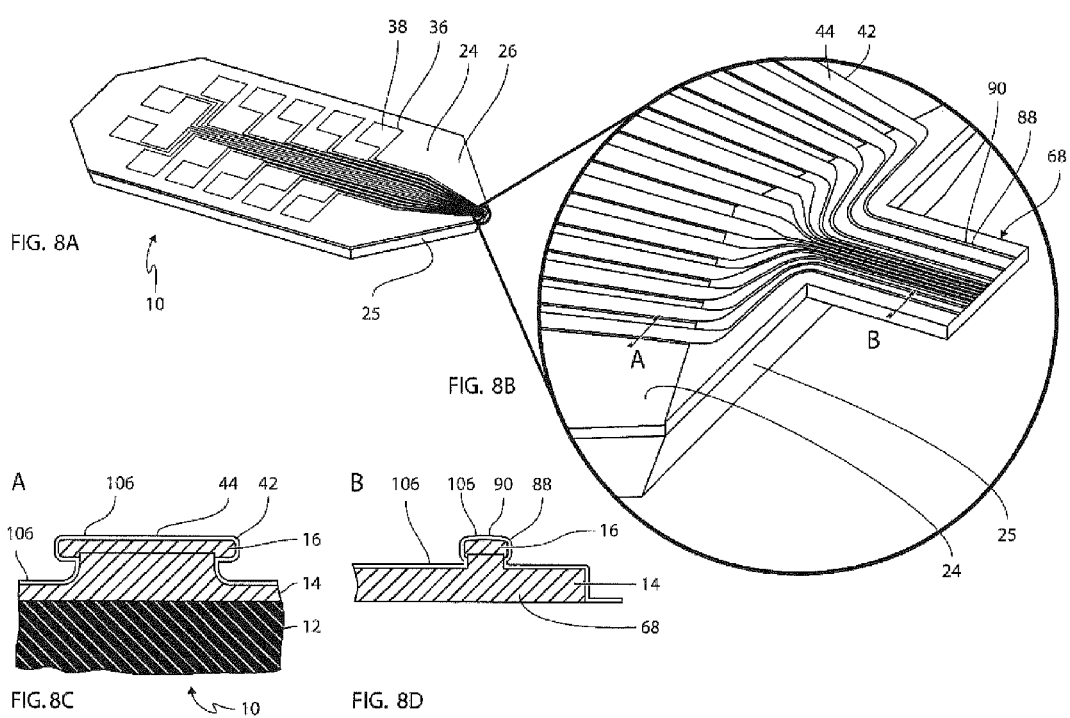

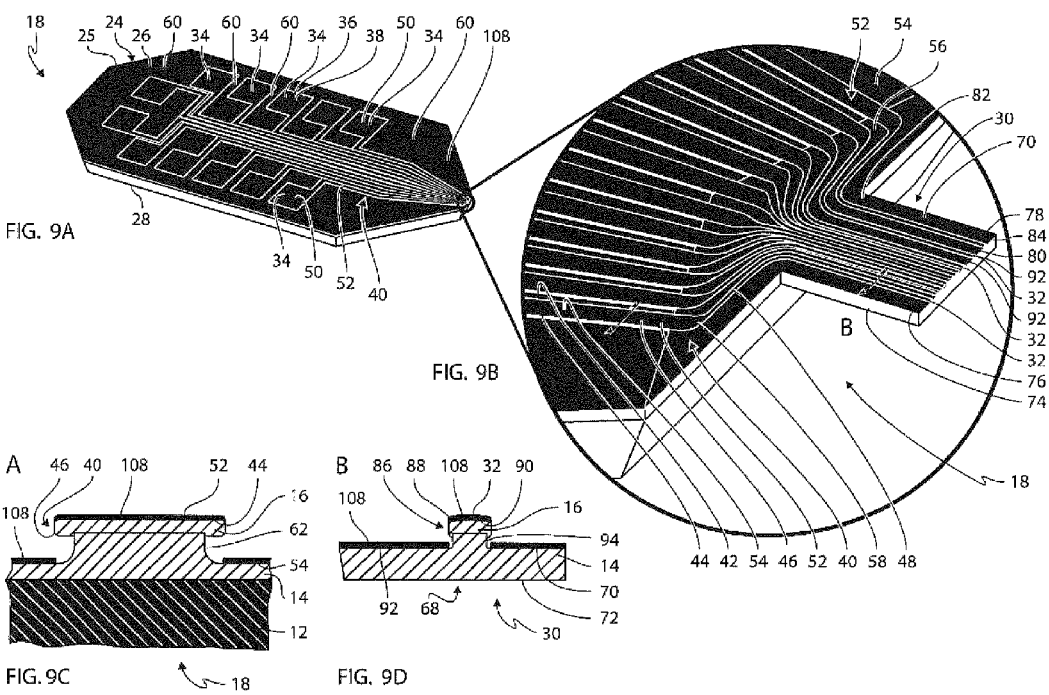

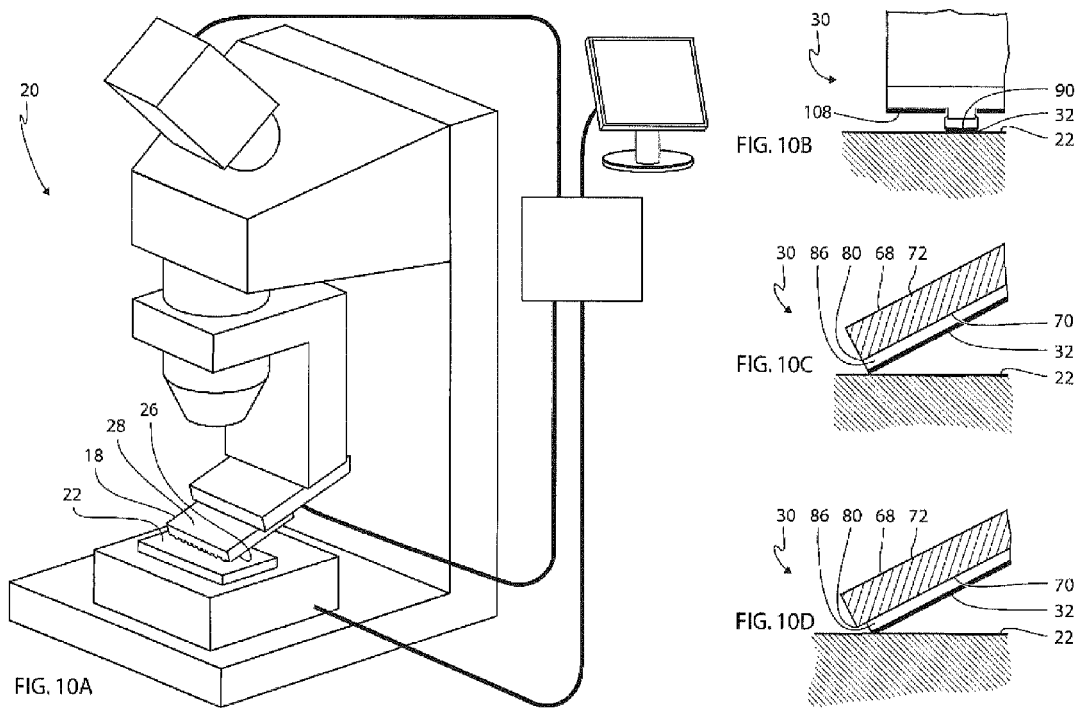

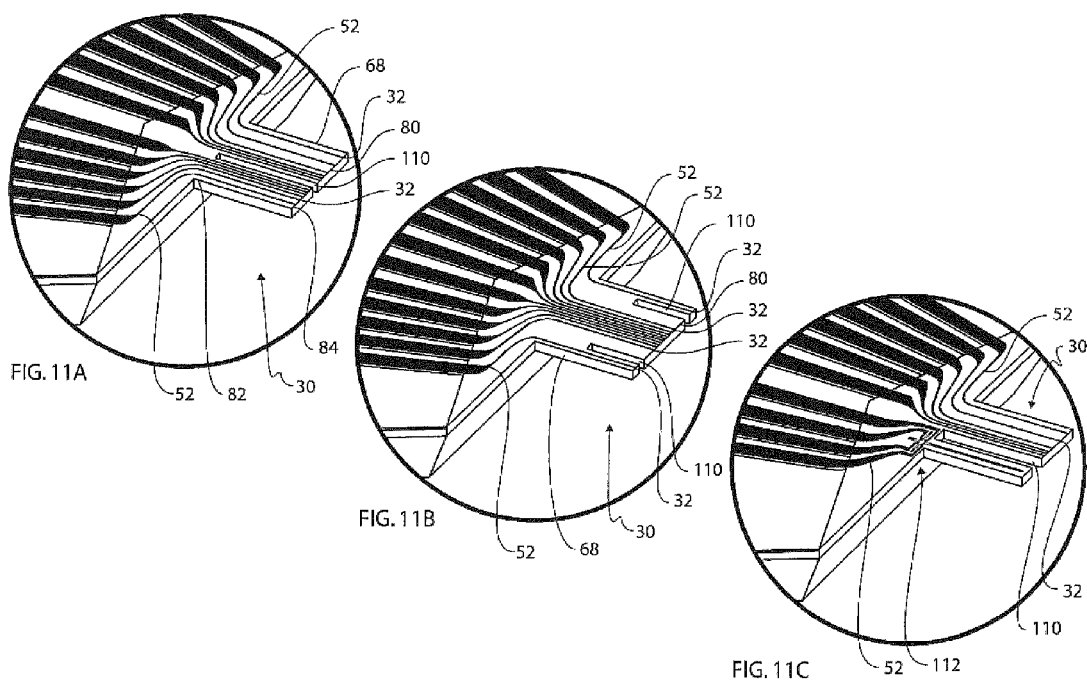

DEEP-ETCHED MULTIPOINT PROBE

CROSS-REFERENCE TO RELATED APPLICATIONS

This application is the national phase entry, under 35 U.S.C. Section 371(c), of International Application No. PCT/EP2013/062830, filed Jun. 20, 2013, claiming priority from European Application No. 12172740.8, filed Jun. 20, 2012. The disclosures of the International Application and the European Application from which this application claims priority are incorporated herein by reference in their entireties.

FEDERALLY SPONSORED RESEARCH OR DEVELOPMENT

Not Applicable

BACKGROUND

The present invention generally relates to high resolution multipoint probes for establishing an electrical connection to a test sample. More specifically, the present invention relates to the prevention of short circuiting in such multipoint probes manufactured of silicon based wafers.

High resolution multipoint probes, and the manufacturing, use, and handling of such probes, are disclosed in EP1095282 (A2), EP1698905 (A2), EP1466182 (A1), EP1610131 (A1), EP1640730 (A1), EP1686387 (A1), EP1782078 (A1), EP1775594 (A1), EP1780550 (A1), EP2016433 (A1), EP1949115 (A1), EP1946124 (A1), EP2293086 (A1), EP1970714 (A1), EP2101181 (A1), EP2132578 (A1), EP2141503 (A1), EP2198316 (A1), EP2237052 (A1), EP2307892 (A1), EP2414846 (A1). Reference is made to the above-mentioned documents. The US patents and published US patent applications claiming the same priorities as specified for the above-mentioned patent documents are hereby incorporated by reference in the present specifications.

High resolution in multipoint probes may be achieved by manufacturing them from a silicon based wafer. The high resolution requires that the contact electrodes of the multipoint probe are positioned close to one another. This means that the traces leading to the contact electrodes are also positioned close to one another, at least at the probe tip. This means that the width of the traces at the probe tip is limited by the resolution of the contact electrodes. The open structure of multipoint probes manufactured from silicon based wafers is sensitive to short circuiting between the traces and other structures of the multipoint probe, in particular for probes with a contact electrode separation below 1 μm. The short circuiting may be caused in the manufacturing process, in which the risk of short circuiting typically increases with increased lengths of the traces. Short circuiting may also be caused when the high resolution multipoint probe is employed in a measurement.

It is an object of the present invention to provide an accurate high resolution multipoint probe with a low risk of internal short circuiting. It is a further object of the present invention to reduce the risk of short circuiting when employing the multipoint probe in a measurement.

The above objects are according to a first aspect of the present invention obtained by a multipoint probe for establishing an electrical connection between a test apparatus and a test sample, the multipoint probe comprising: a base constituting a plate-like structure defining a first top surface, a first bottom surface, and a circumferential first rim interconnecting the first top surface and the first bottom surface, a probe tip provided at the first top surface of the base and freely extending from the circumferential first rim, the probe tip comprising a first plurality of contact electrodes for contacting and establishing an electrical connection to the test sample, a second plurality of contact pad supports provided on the first top surface and supported by the base, and each contact pad support having an outline defining a contact pad support boundary enclosing a contact pad support area, a third plurality of trace supports provided on the first top surface and supported by the base, each trace support having an outline defining a trace support boundary enclosing a trace support area, and each trace support comprising a wide portion connected to a contact pad support of the second plurality of contact pad supports and individually defining a first length and a first width and a narrow portion connected to the probe tip and individually defining a second length and a second width, the first length being longer than the second length and the first width being greater than the second width, a fourth plurality of contact pads for connecting to the test apparatus, each contact pad being individually supported by a contact pad support of the second plurality of contact pad supports and being constituted by a metallic layer covering the contact pad support area of the supporting contact pad support, and a fifth plurality of traces, each trace being individually supported by a trace support of the third plurality of trace supports and being constituted by a metallic layer covering the trace support area of the supporting trace support, each trace individually interconnecting a contact pad of the fourth plurality of contact pads and a contact electrode of the first plurality of contact electrodes, the first plurality, the second plurality, the third plurality, the fourth plurality, and the fifth plurality being equal in numbers, the first top surface comprising first intermediate surfaces, each first intermediate surface individually interconnecting a pair of neighbouring trace supports of the third plurality of trace supports at their respective wide portions, the first top surface comprising second intermediate surfaces, each second intermediate surface individually interconnecting a pair of neighbouring trace supports of the third plurality of trace supports at their respective narrow portions, and the first intermediate surfaces being provided on a first level, the second intermediate surfaces being provided on a second level above the first level relative to the base, and the contact pad support area and the trace support areas being provided on a third level above the first level and the second level relative to the base.

The first width of the wide portion of each trace support of the third plurality of trace supports may be the average width of the wide portion. Alternatively, the first width of the wide portion of each trace support of the third plurality of trace supports may be the minimum width of the wide portion. The second width of the narrow portion of each trace support of the third plurality of trace supports may be the average width of the narrow portion. Alternatively, the second width of the narrow portion of each trace support of the third plurality of trace supports may be the maximum width of the narrow portion.

The providing of the first intermediate surfaces on a first level, the second intermediate surfaces on a second level above the first level relative to the base, and the contact pad support area and the trace support areas on a third level above the first level and the second level relative to the base has the effect of reducing the risk of short circuiting with a maintained spatial resolution of the traces at the probe tip. This effect is further enhanced by the specification that the first length is longer than the second length. That the first width is greater than the second width allows for the first level and the second level to be spaced further apart, which means that the risk for short circuiting can be further reduced.

The first level and the second level may be spaced apart by a first distance, and the second level and the third level may be spaced apart by a second distance, and the first distance may be greater than the second distance. This further reduces the risk for short circuiting.

The first level and the second level may be spaced apart by a first distance, and the second level and the third level may be spaced apart by a second distance, and the first distance may be greater than 0.3 µm, 0.4 µm, 0.5 µm, 0.6 µm, 0.7 µm, 0.8 µm, 0.9 µm, 1 µm, 1.5 µm, or 2 µm, and/or the second distance may be smaller than 2 µm, 1.5 µm, 1 µm, 0.9 µm, 0.8 µm, 0.7 µm, 0.6 µm, 0.5 µm, 0.4 µm, or 0.3 µm.

The first level may define a first plane, the second level may define a second plane parallel to the first plane, and the third level may define a third plane parallel to the second plane.

Each trace support of the third plurality of trace supports may comprise a tapering portion individually interconnecting the wide portion and the narrow portion of the trace support, and the tapering portion may define a narrowing width when going from the wide portion to the narrow portion. Each second intermediate surface may interconnect a pair of neighbouring trace supports of the plurality of trace supports at their respective tapering portions. This has the effect that the transition from the wide portion to the narrow portion will not break if it is subjected only to the undercutting process of the narrow portion.

The first top surface may comprise third intermediate surfaces, each third intermediate surface individually interconnecting a pair of neighbouring contact pad supports of the second plurality of contact pad supports, and the third intermediate surfaces are provided on the first level. This has the effect that that the risk of short circuiting the contact pads is reduced.

Each trace support of the third plurality of trace supports may define a first trace support undercut provided at the wide portion and at the trace support boundary and partly undercutting the trace supports area at the wide portion of the trace support. This has the effect that the risk of short circuiting is further reduced.

The first trace support undercut may define a first undercutting depth being greater than 100 nm, 200 nm, 300 nm, 400 nm, 500 nm, 600 nm, 700 nm, 800 nm, or 900 nm.

Each trace support of the third plurality of trace supports may define a second trace support undercut provided at the narrow portion and at the trace support boundary and partly undercutting the trace supports area at the narrow portion of the trace support. This has the effect that the risk of short circuiting is further reduced.

The second trace support undercut may define a second undercutting depth being smaller than 100 nm, 90 nm, 80 nm, 70 nm, 60 nm, or 50 nm.

The first trace support undercut may be deeper than the second trace support undercut. This has the effect that the risk of short circuiting is further reduced.

Each contact pad support of the second plurality of contact pad supports may define a contact pad support undercut provided at the contact pad support boundary and partly undercutting the contact pad support area of the contact pad support.

The first trace support undercut and the contact pad support undercut may have approximately the same undercutting depth. This has the effect that the multipoint probe is easier to manufacture.

The trace support area may be convex at the narrow portions of each trace support of the third plurality of trace supports. This has the effect that the supported traces do not present any sharp corners, and it is contemplated that the risk is reduced that small short circuiting particles will get stuck between closely positioned traces when converging on a probe tip.

The probe tip may further comprise: a tip base having a proximal end and a distal end and constituting a plate-like tip structure defining a second top surface, a second bottom surface, and a second rim interconnecting the second top surface and the second bottom surface, the second top surface connecting to the second rim along a first side edge extending from the proximal end to the distal end, a second side edge on the opposite side of the tip structure relative to the first side edge and extending from the proximal end to the distal end, and a front edge interconnecting the first side edge and the second side edge, the tip base being connected at its proximal end to the base, a sixth plurality of contact electrode supports provided on the second top surface and supported by the tip base, each contact electrode support being elongated and extending from the proximal end in a direction towards the distal end, and each contact electrode support having an outline defining a contact electrode support boundary enclosing a contact electrode support area, and each contact electrode of the first plurality of contact electrodes being individually supported by a contact electrode support of the sixth plurality of contact electrode supports and being constituted by a metallic electrode layer covering the contact electrode support area of the supporting contact electrode support, the first plurality and the sixth plurality being equal in numbers, the second top surface comprising fourth intermediate surfaces, each fourth intermediate surface individually interconnecting a pair of neighbouring contact electrode supports of the sixth plurality of contact electrode supports, and the fourth intermediate surfaces being provided on a fourth level, the contact electrode support areas being provided on a fifth level above the fourth level relative to the tip base, the fourth level being the same as the second level and the fifth level being the same as the third level.

The fourth intermediate surfaces being provided on a fourth level and the contact electrode support areas being provided on a fifth level has the effect that the risk for short circuiting in the probe tip as such is reduced. Further, particles may get stuck on the probe tip when it is repeatedly used. The contact electrodes protrude from the tip base, which reduces the risk that particles on the test sample will get stuck on the fourth intermediate surfaces of the second top surface, which means that the risk of particles short circuiting the probe arms in repeated measurements is reduced.

The front edge is straight. This has the advantage that the risk of contacting the test sample with the tip base is reduced, which could damage the test sample and cause particles to be released from the test sample that would land on the multi-point probe and cause it to short circuit.

The sixth plurality of electrode supports may extend to and terminates at the front edge. This further reduces the risk of damaging the test sample and generating short circuiting particles when contacting a test sample.

The sixth plurality of electrode supports extends to and terminates at a third distance from the front edge. This has the effect that the distal ends of the contact electrodes can be defined independent of the front edge, which means that their positions can be more accurately determined, thus increasing the accuracy of the contacting.

The third distance may be in one or more of the ranges 0.1 µm to 2 µm, 0.2 µm to 1.5 µm, 0.3 µm to 1 µm, 0.4 µm to 0.9 µm, 0.5 µm to 0.8 µm, 0.6 µm to 0.7 µm, 0.1 µm to 0.2 µm, 0.2 µm to 0.3 µm, 0.3 µm to 0.4 µm, 0.4 µm to 0.5 µm, 0.5 µm to 0.6 µm, 0.6 µm to 0.7 µm, 0.7 µm to 0.8 µm, 0.8 µm to 0.9 µm, 0.9 µm to 1 µm, 1 µm to 1.5 µm, and 1.5 µm to 2 µm.

Each contact electrode support of the sixth plurality of contact electrode supports may define a contact electrode support undercut provided at the contact electrode support boundary and partly undercutting the contact electrode support area of the contact electrode support. This has the effect that the risk of short circuiting in the probe tip is further reduced.

The contact electrode support undercut may define a third undercutting depth being smaller than 100 nm, 90 nm, 80 nm, 70 nm, 60 nm, or 50 nm.

The second trace support undercut and the contact electrode under having approximately the same undercutting depth. This has the advantage that the probe is easier to manufacture.

The contact electrode support area may be convex. This has the effect that the contact electrodes do not present any sharp corners or edges, and it is contemplated that the risk is reduced that small short circuiting particles will get stuck between closely positioned contact electrodes. Further, the risk of sharp corners or edges damaging a test sample and causing short circuiting particles to be released is reduced. Also, the convexity means that it is most likely that a test sample is contacted by the centre of the contact element, which increases the accuracy and precision of the contacting.

The above objects are according to a second aspect of the present invention obtained by a probe tip for establishing an electrical contact to test sample, the probe tip comprising: a tip base having a proximal end and a distal end and constituting a plate-like tip structure defining a top surface, a bottom surface, and a rim interconnecting the top surface and the bottom surface, the top surface connecting to the rim along a first side edge extending from the proximal end to the distal end, a second side edge on the opposite side of the tip structure relative to the first side edge and extending from the proximal end to the distal end, and a front edge interconnecting the first side edge and the second side edge, a first plurality of contact electrodes for contacting and establishing an electrical connection to the test sample, a second plurality of contact electrode supports provided on the second top surface and supported by the tip base, each contact electrode support being elongated and extending from the proximal end in a direction towards the distal end, and each contact electrode support having an outline defining a contact electrode support boundary enclosing a contact electrode support area, and each contact electrode of the first plurality of contact electrodes being individually supported by a contact electrode support of the second plurality of contact electrode supports and being constituted by a metallic electrode layer covering the contact electrode support area of the supporting contact electrode support, the first plurality and the second plurality being equal in numbers, the top surface comprising intermediate surfaces, each intermediate surface individually interconnecting a pair of neighbouring contact electrode supports of the second plurality of contact electrode supports, and the intermediate surfaces being provided on a first level, the contact electrode support areas being provided on a second level above the first level relative to the tip base.

The intermediate surfaces being provided on a first level and the contact electrode support areas being provided on a second level has the effect that the risk for short circuiting in the probe tip as such is reduced. Further, particles may get stuck on the probe tip when it is repeatedly used. The contact electrodes protrude from the tip base, which reduces the risk that particles on the test sample will get stuck on the fourth intermediate surfaces of the second top surface, which means that the risk of particles short circuiting the probe arms in repeated measurements is reduced.

The front edge may be straight. This has the advantage that the risk of contacting the test sample with the tip base is reduced, which could damage the test sample and cause particles to be released from the test sample that would land on the multi-point probe and cause it to short circuit.

The second plurality of electrode supports may extend to and terminates at the front edge. This further reduces the risk of damaging the test sample and generating short circuiting particles when contacting a test sample.

The second plurality of electrode supports extends to and terminates at a distance from the front edge. This has the effect that the distal ends of the contact electrodes can be defined independent of the front edge, which means that their positions can be more accurately determined, thus increasing the accuracy of the contacting.

The distance may be in one or more of the ranges 0.1 µm to 2 µm, 0.2 µm to 1.5 µm, 0.3 µm to 1 µm, 0.4 µm to 0.9 µm, 0.5 µm to 0.8 µm, 0.6 µm to 0.7 µm, 0.1 µm to 0.2 µm, 0.2 µm to 0.3 µm, 0.3 µm to 0.4 µm, 0.4 µm to 0.5 µm, 0.5 µm to 0.6 µm, 0.6 µm to 0.7 µm, 0.7 µm to 0.8 µm, 0.8 µm to 0.9 µm, 0.9 µm to 1 µm, 1 µm to 1.5 µm, and 1.5 µm to 2 µm.

Each contact electrode support of the second plurality of contact electrode supports may define a contact electrode support undercut provided at the contact electrode support boundary and partly undercutting the contact electrode support area of the contact electrode support. This has the effect that the risk of short circuiting in the probe tip is further reduced.

The contact electrode support undercut may define an undercutting depth being smaller than 100 nm, 90 nm, 80 nm, 70 nm, 60 nm, or 50 nm.

The contact electrode support area may be convex. This has the effect that the contact electrodes do not present any sharp corners or edges, and it is contemplated that the risk is reduced that small short circuiting particles will get stuck between closely positioned contact electrodes. Further, the risk of sharp corners or edges damaging a test sample and causing short circuiting particles to be released is reduced. Also, the convexity means that it is most likely that a test sample is contacted by the centre of the contact element, which increases the accuracy and precision of the contacting.

The first level and the second level may be spaced apart by a first distance, and the first distance is smaller than 2 µm, 1.5 µm, 1 µm, 0.9 µm, 0.8 µm, 0.7 µm, 0.6 µm, 0.5 µm, 0.4 µm, or 0.3 µm.

The above objects are according to a third aspect of the present invention obtained by a method for manufacturing a multipoint probe, the method comprising: providing a wafer comprising a bottom layer of a first material, an intermediate layer of a second material, and a top layer of a third material, and the bottom layer, the intermediate layer, and the top layer being arranged in a sandwiched structure, covering the top layer with a first mask corresponding in coverage to the contact pad support areas of the second plurality of contact pad supports and the trace support areas of the third plurality of trace supports, performing a first etching of the top layer for removing all the top layer that is not protected by the first mask, removing the first mask, and subsequently performing a second etching of the intermediate layer for removing a second amount of the intermediate layer that is not covered by the remaining top layer and for providing the narrow portions of the third plurality of trace supports and the second intermediate surfaces, or alternatively performing a second etching of the intermediate layer for removing a second amount of the intermediate layer that is not covered by the remaining top layer and for providing the narrow portions of the third plurality of trace supports and the second intermediate surfaces and subsequently removing the first mask, covering the intermediate layer with a second mask corresponding in coverage to the narrow portion of each of the third plurality of trace supports and the second intermediate surfaces, performing a third etching the intermediate layer for removing a third amount of the intermediate layer that is not protected by the second mask and for providing the second plurality of contact pad supports, the wide portions of the third plurality of trace supports and the first intermediate surfaces, removing the second mask, covering the remaining top layer and the remaining intermediate layer with a third mask corresponding in coverage to the top surface and the probe tip, performing a fourth etching for removing the remaining parts of the intermediate layer and the top layer that are not protected by the third mask, removing the third mask, covering the bottom layer on the opposite side as the intermediate layer with a fourth mask corresponding in coverage to the bottom surface, performing a fifth etching for removing the parts of the bottom layer that are not protected by the fourth mask for providing the circumferential first rim, the first bottom surface, and the probe tip freely extending from the circumferential first rim, and depositing a metallic film on the remaining top layer and the remaining intermediate for providing the first plurality of contact electrodes, the fourth plurality of contact pads, and the fifth plurality of traces.

The multipoint probe may be a multi point probe according to the first aspect of the present invention. The fourth etching may be further performed for providing the rim of the tip base and the sixth plurality of electrode supports terminating at the front edge. Alternatively, the fourth etching may further be performed for providing the rim of the tip base and the sixth plurality of electrode supports terminating at a third distance from the front edge.

The first material may be crystalline silicon, the second material may be silicon dioxide, and the third material may be amorphous silicon layer.

The method may further comprise prior to covering the remaining top layer and the remaining intermediate layer with a third mask: subjecting the top layer to an oxidation for transforming the third material to silicon dioxide.

The oxidation has the effect that the intermediate layer and the top layer are of similar materials albeit provided separately. This means that internal stresses between the different layers of the probe tip may be reduced, which reduces the risk of delamination of the intermediate and top layers, and also the risk for deformation of the probe tip as a whole.

The subjecting of the top layer to an oxidation may further provide the trace support area being convex at the narrow portions of each trace support of the third plurality of trace supports. The subjecting of the top layer to an oxidation may further be for providing the contact electrode support area being convex. The subjecting of the top layer to an oxidation may further be for providing the second trace support undercut of each trace support of the third plurality of trace supports. This has the effect that the risk for short circuiting is reduced when depositing the metallic film.

The subjecting of the top layer to an oxidation may further be for the providing of the contact electrode support undercuts of each contact electrode support of the sixth plurality of contact electrode supports. This has the effect that the risk for short circuiting is reduced when depositing the metallic film.

The oxidation may comprise a wet oxidation with water at a temperature between 900 C and 1150 C, or at a temperature of 950 C.

The bottom layer may have a thickness greater than 50 µm, 100 µm, 150 µm, 200, or 300 µm, and the intermediate layer may have a thickness in one or more of the ranges 1 µm to 2 µm, 1.1 µm to 1.9 µm, 1.2 µm to 1.8 µm, 1.3 µm to 1.7 µm, 1.4 µm to 1.6 µm, 1.1 µm to 1.2 µm, 1.2 µm to 1.3 µm, 1.3 µm to 1.4 µm, 1.4 µm to 1.5 µm, 1.5 µm to 1.6 µm, 1.6 µm to 1.7 µm, 1.7 µm to 1.8 µm, 1.8 µm to 1.9 µm, and/or 1.9 µm, to 2 µm, and the top layer may have a thickness in one or more of the ranges 20 nm to 150 nm, 30 nm to 140 nm, 40 nm to 130 nm, 50 nm to 120 nm, 60 nm to 110 nm, 70 nm to 100 nm, 80 nm to 90 nm, 20 nm to 30 nm, 30 nm to 40 nm, 40 nm to 50 nm, 50 nm to 60 nm, 60 nm to 70 nm, 70 nm to 80 nm, 80 nm to 90 nm, 90 nm to 100 nm, 100 nm to 110 nm, 110 nm to 120 nm, 120 nm to 130 nm.

The first etching may be a vertical dry etching adapted for selectively etching the first material. A vertical etching is here and throughout the specifications understood to provide an etching in a direction normal to the one or more layer of a wafer. This means that the vertical etching provides no, or an insignificant, undercutting of the etched structures. The first etching may comprise a first deep reactive ion etch. The first deep reactive ion etch may comprise $C_4F_8$ and $SF_6$ gases.

The second etching may be a vertical dry etching and adapted for selectively etching the second material The second etching may comprise a second deep reactive ion etch. The second deep reactive ion etch may comprise $C_4F_8$ gas. The first etching and the second etching may define a first etching depth in the second material that is smaller than 2 µm, 1.5 µm, 1 µm, 0.9 µm, 0.8 µm, 0.7 µm, 0.6 µm, 0.5 µm, 0.4 µm, or 0.3 µm. The first etching and the second etching may define the third distance.

The third etching may be an etching adapted for selectively etching the second material. The third etching may comprise a first wet etch. This has the effect that undercuttings can be provided in the non-masked portions. The first wet etch may comprise buffered hydrogen fluoride. The third etching in addition to the second etching may provide a second etching depth in the second material that is greater than 0.3 µm, 0.4 µm, 0.5 µm, 0.6 µm, 0.7 µm, 0.8 µm, 0.9 µm, 1 µm, 1.5 µm, or 2 µm. The third etching may provide the first trace support undercut of each trace support of the third plurality of trace supports.

The fourth etching may be an etching adapted for selectively etching the second material. The fourth etching may comprise a third deep reactive ion etch. The fourth deep reactive ion etch may comprise $C_4F_8$ gas.

The fifth etching may be an etching adapted for selectively etching the third material. The fifth etching may comprise a second wet etch. The second wet etch comprises a potassium hydroxide solution.

The method according to the third aspect of the present invention may further comprise prior to performing the fifth etching: covering the whole of the remaining top layer, the remaining intermediate layer, and the bottom layer with a protective film, and removing one or more portions of the protective film on the bottom layer on the opposite side of the intermediate layer for providing the fourth mask. Said protective film may comprise a silicon nitride layer and the one or more portions of the protective film may be removed by photolithography involving vertical dry etching.

The method according to the third aspect of the present invention may further comprise prior to covering the intermediate layer with a second mask: performing an additional etching for providing the second trace support undercut of each trace support of the third plurality of trace supports. The additional etching may further be for providing the contact electrode support undercuts of each contact electrode support of the sixth plurality of contact electrode supports. The additional etching may be an etching adapted for selectively etching the second material. The additional etching may comprise an additional wet etch. This has the effect that undercuttings can be provided in the non-masked portions. The additional wet etch may comprise buffered hydrogen fluoride.

The above objects are according to a fourth aspect of the present invention obtained by a method for manufacturing a probe tip, the method comprising: providing a wafer comprising a bottom layer of a first material, an intermediate layer of a second material, and a top layer of a third material, and the bottom layer, the intermediate layer, and the top layer being arranged in a sandwiched structure, covering the top layer with a first mask corresponding in coverage to the second plurality of contact electrode supports, performing a first etching of the top layer for removing all the top layer that is not protected by the first mask, removing the first mask and subsequently performing a second etching of the intermediate layer for removing a second amount of the intermediate layer that is not covered by the remaining top layer and for providing the second plurality of contact electrode supports and the intermediate surfaces, or alternatively performing a second etching of the intermediate layer for removing a second amount of the intermediate layer that is not covered by the remaining top layer and for providing the second plurality of contact electrode supports and the intermediate surfaces and subsequently removing the first mask, covering the remaining top layer and the remaining intermediate layer with a second mask corresponding in coverage to the top surface and the probe tip, performing a third etching for removing the remaining parts of the intermediate layer and the top layer that are not protected by the second mask and for providing the rim of the tip base, removing the second mask, performing a fourth etching for removing the bottom layer for providing the bottom surface, and depositing a metallic film on the remaining top layer and the remaining intermediate for providing the first plurality of contact electrodes.

The probe tip may be a probe tip according to the second aspect of the present invention. The third etching may further be performed for providing the front edge being straight. The third etching may further be performed for providing the sixth plurality of electrode supports terminating at the front edge. Alternatively, the third etching may further be performed for providing the sixth plurality of electrode supports terminating at a third distance from the front edge.

The first material may be crystalline silicon, the second material may be silicon dioxide, and the third material may be amorphous silicon layer.

The method according to the fourth aspect of the present invention may further comprise prior to covering the remaining top layer and the remaining intermediate layer with a second mask: subjecting the top layer to an oxidation for transforming the third material to silicon dioxide.

The oxidation has the effect that the intermediate layer and the top layer are of similar materials, even though they have been provided separately. This means that internal stresses may be reduced, which reduces the risk of delamination of the intermediate and top layer when flexing the probe tip in a contacting, and also the risk for deformation of the probe tip as a whole. This may also mean that if the third etching is selective to the second material of the intermediate layer, it is also selective to the oxidized material of the top layer. This has the advantage that the top layer and the intermediate layer define a common edge provided in a single etching step. This means that structures provided from the top layer, such as a contact electrode support, may be positioned exactly at the edge of the underlying structure from the intermediate layer, such as a tip base.

The subjecting of the top layer to an oxidation may further be for providing the contact electrode support area being convex. The subjecting of the top layer to an oxidation may further be for the contact electrode support undercuts of each contact electrode support of the sixth plurality of contact electrode supports. This has the effect that the risk for short circuiting is reduced when depositing the metallic film.

The oxidation may comprise a wet oxidation with water at a temperature between 900 C and 1150 C, or at a temperature of 950 C.

The bottom layer may have a thickness greater than 50 μm, 100 μm, 150 μm, 200, or 300 μm and the intermediate layer may have a thickness in one or more of the ranges 1 μm to 2 μm, 1.1 μm to 1.9 μm, 1.2 μm to 1.8 μm, 1.3 μm to 1.7 μm, 1.4 μm to 1.6 μm, 1.1 μm to 1.2 μm, 1.2 μm to 1.3 μm, 1.3 μm to 1.4 μm, 1.4 μm to 1.5 μm, 1.5 μm to 1.6 μm, 1.6 μm to 1.7 μm, 1.7 μm to 1.8 μm, 1.8 μm to 1.9 μm, and/or 1.9 μm to 2 μm, and the top layer may have a thickness in one or more of the ranges 20 nm to 150 nm, 30 nm to 140 nm, 40 nm to 130 nm, 50 nm to 120 nm, 60 nm to 110 nm, 70 nm to 100 nm, 80 nm to 90 nm, 20 nm to 30 nm, 30 nm to 40 nm, 40 nm to 50 nm, 50 nm to 60 nm, 60 nm to 70 nm, 70 nm to 80 nm, 80 nm to 90 nm, 90 nm to 100 nm, 100 nm to 110 nm, 110 nm to 120 nm, 120 nm to 130 nm.

The first etching may be a vertical dry etching adapted for selectively etching the first material. The first etching may comprise a first deep reactive ion etch. The first deep reactive ion etch may comprise $C_4F_8$ and $SF_6$ gases.

The second etching may be a vertical dry etching and adapted for selectively etching the second material. The second etching may comprise a second deep reactive ion etch. The second deep reactive ion etch may comprise $C_4F_8$ gas.

The first etching and the second etching may define a first etching depth in the second material that is smaller than 2 μm, 1.5 μm, 1 μm, 0.9 μm, 0.8 μm, 0.7 μm, 0.6 μm, 0.5 μm, 0.4 μm, or 0.3 μm.

The third etching may be an etching adapted for selectively etching the second material. The third etching may comprise a third deep reactive ion etch. The fourth deep reactive ion etch may comprise $C_4F_8$ gas.

The fourth etching may be an etching adapted for selectively etching the third material. The fourth etching may comprise a second wet etch. The second wet etch may comprise a potassium hydroxide solution.

The method according to the fourth aspect of the present invention may further comprise prior to performing the fourth etching: covering the whole of the remaining top layer and the remaining intermediate layer with a protective film. The protective film may comprise a silicon nitride layer.

The method according to the fourth aspect of the present invention may further comprise prior to covering the intermediate layer with a second mask: performing an additional etching for providing the contact electrode support undercuts of each contact electrode support of the sixth plurality of contact electrode supports. The additional etching may be an etching adapted for selectively etching the second material. The additional etching may comprise an additional wet etch. This has the effect that undercuttings can be provided in the non-masked portions. The additional wet etch may comprise buffered hydrogen fluoride.

In all of the above aspects of the present invention, the front edge and the tip base may be divided into a first and a second front edge portion and a first and a second tip base portions, respectively, by a first slit extending from the distal end in a direction towards the proximal end and provided between a pair of neighbouring contact electrodes of the first plurality of contact electrodes. The first slit may extend to approximately halfway between the proximal and the distal end. Alternatively, the first slit may extend to the proximal end.

The front edge may be is cut into a seventh plurality of portions by an eighth plurality of second slits, and each second slit extends in a direction from the distal end to the proximal end and is provided between a pair of neighbouring contact electrodes of the first plurality of contact electrodes 32. Each second slit may terminate at a point between half the front edge and halfway between the distal end and the proximal end. The first and second slits have the effect that internal stresses in the larger tip base 68 are avoided when contacting, in particular if a front corner between the front edge an one of the side edges first engages a test sample.

In all of the above aspects, the metallic film may comprise an adhesion layer of titanium or chromium provided on the wafer and a conductive layer of gold or nickel. The adhesion layer may be thinner than the conductive layer. The adhesion layer may be about 10 nm thick and the conductive layer may be about 100 nm thick.

In the first and second aspects of the present invention, an intermediate metallic layer may be provided on and covering the first, second, third and/or fourth intermediate surfaces. In the third and fourth aspects of the present invention, the depositing of the metal film may also provide an intermediate metallic layer on and covering the first, second, third and/or fourth intermediate surfaces.

BRIEF DESCRIPTION OF THE DRAWINGS

An embodiment of the present invention is disclosed in relation to the figures:

FIGS. 1 to 9 illustrating the method of providing the multipoint probe, where the sub-images A illustrate the overall structure, sub-images B illustrate the structure at the tip area of the multipoint probe, sub-images C illustrate the sectional through cut indicated by A in sub-images B, and sub-images D illustrate the sectional through cut indicated by B in sub-images B, FIG. 10A illustrating the use of the multipoint probe, FIG. 10B illustrating a front view of the tip of the multipoint probe in a contacting with a test sample, FIG. 10C illustrating a sectional side view of the tip of the multipoint probe in a contacting with a test sample, FIG. 10D illustrating a sectional side view of an alternative tip of the multipoint probe in a contacting with a test sample, and FIGS. 11A-C illustrating alternative embodiments of the probe tip.

DETAILED DESCRIPTION

FIG. 1A-D illustrates a wafer 10 having a bottom layer 12 of crystalline silicon, an intermediate layer 14 of silicon dioxide, and a top layer 16 of amorphous silicon. The layers are parallel and each layer has a uniform thickness. The wafer 10 has been provided from a pure crystalline silicon wafer, in which the intermediate layer 14 has been provided by a wet oxidation at 950 C using water as the oxygen source, and the top layer 16 has been deposited on the intermediate layer 14 by a low pressure chemical vapour deposition process at 550 C using Silane ($SiH_4$) as the reactive gas. Alternatively, a mixture of hydrogen and oxygen gas may be used as an oxygen source. The bottom layer is provided with a thickness of about 340 µm the intermediate layer 14 is provided with a thickness between 1.4 µm and 1.5 µm, and the top layer 16 is provided with a thickness between 70 nm and 100 nm.

The top layer 16 of the wafer 10 is covered by a first mask 100 corresponding in coverage to contact pad support areas 38, trace support areas 44, and contact electrode support areas 90. The first mask is provided by a deep UV lithographic technique using a stepper and photo resist.

A first etching is performed removing all of the top layer 16 that is not protected by the first mask 100. The first etching is a vertical dry etching in the form of a first deep reactive ion etching that etches the amorphous silicon of the top layer 16. The first etching is done by $C_4F_8$ and $SF_6$ gases and reactive ions are formed by plasma generation. The vertical etching is obtained by applying a bias voltage towards the top layer 16 of the wafer 10, which results in a sputtering of the amorphous silicon in addition to the chemical etch. The first mask 100 is subsequently removed.

FIGS. 2A-D show the wafer 10 after the first mask 100 has been removed, revealing the contact pad support boundaries 36 surrounding the contact pad support areas 38, trace support boundaries 52 surrounding the trace support areas 44, and contact electrode support boundaries 88 surrounding the contact electrode support areas 90.

A second etching is performed removing 200 nm to 500 nm of the intermediate layer 14 that is not protected by the remaining top layer 16. The second etching is a vertical dry etching in the form of a second deep reactive ion etching that etches the silicon dioxide of the intermediate layer 14. The second etching is done by $C_4F_8$ gas and reactive ions are formed by plasma generation. The vertical etching is obtained by applying a bias voltage towards the wafer 10, which results in a sputtering of the silicon dioxide in addition to the chemical etch. In an alternative embodiment, the first mask 100 may remain during the second etching and be removed first the second etching is completed.

FIGS. 3A-D show the wafer 10 after the second etching, revealing the narrow portions 48 of the of trace supports, second intermediate surfaces 56 between the narrow portions 48 of the trace supports 40, contact electrode supports 86, and fourth intermediate areas 92 between the contact electrode supports 86.

As is illustrated in FIGS. 4A-D, the remaining top layer 16 and the exposed intermediate layer 14 of the wafer 10 is covered by a second mask 102 corresponding in coverage to the narrow portions 48 the trace supports, the second intermediate surfaces 56, the contact electrode supports 86, and the fourth intermediate surfaces 92. The second mask is a photo resist mask.

A third etching is performed removing approximately 500 nm of the silicon dioxide of the intermediate layer 14 that is not protected by the second mask 102 or the remaining top layer 16. The second etching is a first wet etch employing a buffered hydrogen fluoride solution. The third etching has little or no effect on the remaining top layer 16, which means that it provides first trace support undercuts 62 undercutting the trace support areas 44 at their respective trace support boundary 42, as is shown in FIG. 4C. The third etching further provides the wide portions 46 of the trace supports 40 and first intermediate surfaces 54 between the wide portions 46 of the trace supports 40. The third etching also provides the contact pads supports 34, third intermediate areas 60 between the contact pad supports 34, and contact pad support undercuts (not shown but similar to 62) undercutting the contact pad support areas 38 at their respective contact pad support boundary 36, similar to the profile shown in FIG. 4C. The second mask 102 is subsequently removed.

The top layer 16 is subjected to an oxidation for transforming the amorphous silicon to silicon dioxide. This is achieved by a wet oxidation with water at a temperature of approximately 950 C. The oxidation of the top layer 16 reduces stressed between the top layer 16 and the intermediate layer 14. This causes the material of the top layer 16 to expand, which in turn causes the trace support areas at the narrow portions 48 of each trace support 40 and the contact electrode support areas 90 of each contact electrode support 86 to take a convex shape, as is illustrated in FIG. 5D.

The expansion of the top layer 16 also provides contact electrode support undercuts 94 of each contact electrode support 86, as is shown in FIG. 5D, and a second trace support undercut of the narrow portions of each trace support 40 (not shown but similar to 94). The oxidation of the top layer also contributes to the already present first trace support undercut 62 and contact pad undercut (not shown but similar to 62).

The contact electrode support undercuts 94 are undercutting the contact electrode support areas 90 at the contact electrode boundaries 88 of each contact electrode support 86. Similarly, the second trace support undercuts are undercutting the trace support areas at the trace support boundaries 42 of the narrow portions 48 of each trace support 40.

The top layer and the remaining intermediate layer are coved by a third mask 104 corresponding in coverage to the first top surface 26 of the base multipoint probe and the second top surface 70 of the tip base 68; and a fourth etching is performed removing the remaining parts of the intermediate layer and the top layer that are not protected by the third mask, as is illustrated in FIG. 6A-D. The third mask is a photo resist mask and the fourth etching is a third deep reactive ion etch similar to the second deep reactive ion etch described above, but terminated first when the exposed silicon dioxide is fully etched with the crystalline silicon of the bottom layer serving as a stop for the fourth etching.

The fourth etching provides the second rim 74 of the tip base 68 having the first side edge 76, the second side edge 78, and the front edge 80. The first side edge 76 and the second side edge 78 extend from the proximal end 82 to the distal end 84 of the tip base 68 and are parallel. The front edge 78 is perpendicular to the first side edge 76 and the second side edge 78.

The fourth etching provides a front edge 80 that is straight and cuts the intermediate layer 14 and the top layer 16 such that the contact electrode supports 86 terminate at the front edge 80. This is illustrated in the sectional side view of FIG. 10C. In an alternative embodiment, the fourth etching cuts the intermediate layer 14 and the top layer 16 such that the contact electrode supports 86 terminate at a distance from the front edge 80. This is illustrated in the sectional side view of FIG. 10D.

The whole of the remaining wafer 10, i.e. all exposed sides of the remaining top layer 16, intermediate layer 14, and bottom layer 12, are covered with a protective film 106, as is illustrated in FIGS. 7A-D. The protective film 106 is a 300 nm to 400 nm layer of low stress silicon nitride provided by low pressure chemical vapour deposition (LPCVD) with di-chlore silane ($Cl_2H_2Si$) and ammonia ($NH_3$) as active gases at a temperature of about 840 C.

A fourth mask (not shown) corresponding in coverage to a bottom surface of the multipoint probe is provided on the bottom layer 12 and on the side of the bottom layer 12 that is opposite from the intermediate layer 14. The fourth mask is provided by photolithography on the protective layer 106 in which the unmasked areas of the protective layer 106 are removed. In the preferred embodiment, the unmasked areas of the protective layer 106 are removed by a vertical dry etching. A fifth etching is performed removing the parts of the bottom layer 12 that are not protected by the fourth mask. This is illustrated in FIGS. 8A-D. The fifth etching is a second wet etch with a potassium hydroxide solution.

The fifth etching provides the base 24 with a first bottom surface (not shown), the first top surface 26, and a circumferential first rim 25 interconnecting the first top surface 26 and the bottom surface. The fifth etching completely removes the bottom layer 12 from under the intermediate layer 14 of the tip base 68, thus providing the tip base 68 freely extending from the circumferential first rim 25. It should be noted that the fourth etching described in relation to FIGS. 6A-D partly provides the circumferential first rim 25. The protective film 106 is subsequently removed by a wet etch process using a phosphoric acid solution at 180 C.

A metallic film 108 is deposited on the remaining top layer 16 and the remaining intermediate layer 14, as is illustrated in FIGS. 9A-D. This provides the contact electrodes 32 on the contact electrode support areas 90 of the contact electrode supports 86, the traces 52 on the trace support areas 44 of the trace supports 40, the contact pads 50 on the contact pad supports areas (38 in FIG. 4A) of the contact pad supports (34 in FIG. 4A).

The metallic film 108 is deposited by using an e-gun evaporation process. The metallic film 108 comprises a thin adhesion layer of about 10 nm of titanium, or alternatively chromium, and a thicker conductive layer of about 100 nm of gold, or alternatively nickel. This means that the metallic film is also deposited on the first intermediate surfaces 54, the second intermediate surfaces 56, the third intermediate surfaces 60, and the fourth intermediate surfaces 92.

The metal film is deposited in a given direction normal to the first top surface 26. Short circuiting may be caused when depositing the metal film 108. Thus, the first trace support undercut 62, the second trace support undercut (not shown but similar to 94), the contact pad support undercut (not shown but similar to 62), and the contact electrode support undercut 94 prevent a short circuiting of the wide portions 46 of the traces 52, the narrow portions 48 of the traces 52, the contact pads 50, and the contact electrodes 32, respectively.

The first intermediate surfaces 56 and the third intermediate surfaces 60 are on a first level, while the second intermediate surfaces 56 and the fourth intermediate surfaces 92 are on a second level above the first level relative to the bottom layer 12. The trace support areas 44, the contact pad support areas 38, and the contact electrode support areas 90 are on the same third level above the first and the second levels relative to the bottom layer 12. The risk for short circuiting per unit length is greater for a smaller separation between the levels. The narrow portions 48 of the trace supports 52 are significantly shorter than the wide portions 46 of the trace supports 52 and the contact pad boundaries 36. This means that the risk of short circuiting the multipoint probe 18 is significantly reduced.

The risk of short circuiting when depositing the metal film is further reduced by the first trace support undercut 62, the second trace support undercut (not shown but similar to 94), the contact pad support undercut (not shown but similar to 62), and the contact electrode support undercut 94.

In an alternative embodiment, the risk of short circuiting can be further reduced by performing an additional etching of the intermediate layer 14 prior to covering the intermediate layer with a second mask, as is described in relation to FIGS. 4A-D. The additional etching is a third wet etch removing approximately 50 nm of the silicon dioxide of the intermediate layer 14 that is not protected by the remaining top layer 16. The second etching is provided by a buffered hydrogen fluoride solution. The additional etching has little or no effect on the remaining top layer 16, which means that it also contributes to the second trace support undercut (not shown but similar to 94) and the contact electrode support undercut 94.

The additional etching will increase the depth of the second trace support undercut (not shown but similar to 94) and the depth of the contact electrode support undercut 94. It will also increase the depth of the first trace support undercut 62 and the depth of the contact pad support undercut (not shown but similar to 62). However, the effect will be small, since these undercuts are further provided by the third etching with a depth of approximately 500 nm, as disclosed in relation to FIGS. 4A-C.

FIGS. 9A-D show a multipoint probe 18 for establishing an electrical connection between a test apparatus and a test sample. The multipoint probe 10 has a base 24 constituting a plate-like structure defining a first top surface 26, a first bottom surface 28, and a circumferential first rim 25 interconnecting the first top surface 24 and the first bottom surface 28. A probe tip 30 is provided at the first top surface 26 of the base 24 and freely extending from the circumferential first rim 25. The probe tip 30 has a first plurality of contact electrodes 32 for contacting and establishing an electrical connection to a test sample.

The multipoint probe 18 also has a second plurality of contact pad supports 34 provided on the first top surface 26 and supported by the base 24. Each contact pad support 34 has an outline defining a contact pad support boundary 36 enclosing a contact pad support area 38. A third plurality of trace supports 40 is provided on the first top surface 26 and supported by the base 24. Each trace support 40 has an outline defining a trace support boundary 42 enclosing a trace support area 44. Each trace support 40 has a wide portion 46 connected to a contact pad support 34 of the second plurality of contact pad supports 34 and individually defining a first length and a first width. Each trace support 40 also has a narrow portion 48 connected to the probe tip 30 and individually defining a second length and a second width. The first length is longer than the second length and the first width is greater than the second width.

The multipoint probe 18 also has a fourth plurality of contact pads 50 for connecting to a test apparatus. Each contact pad 50 is individually supported by a contact pad support 34 of the second plurality of contact pad supports 34 and is constituted by a metallic layer 108 covering the contact pad support area 38 of the supporting contact pad support 34. The multipoint probe 18 also has a fifth plurality of traces 52. Each trace 52 is individually supported by a trace support 40 of the third plurality of trace supports 40 and is constituted by a metallic layer 108 covering the trace support area 44 of the supporting trace support 40. Each trace 52 individually interconnects a contact pad 50 of the fourth plurality of contact pads 50 and a contact electrode 32 of the first plurality of contact electrodes 32.

The first plurality, the second plurality, the third plurality, the fourth plurality, and the fifth plurality are equal in numbers. The first top surface 26 has first intermediate surfaces 54. Each first intermediate surface 54 individually interconnects a pair of neighbouring trace supports 40 of the third plurality of trace supports 40 at their respective wide portions 46. The first top surface 26 has second intermediate surfaces 56. Each second intermediate surface 56 individually interconnects a pair of neighbouring trace supports 40 of the third plurality of trace supports 40 at their respective narrow portions 48.

The first intermediate surfaces 54 are provided on a first level, the second intermediate surfaces 56 are provided on a second level above the first level relative to the base 24. The contact pad support area 38 and the trace support areas 44 are provided on a third level above the first level and the second level relative to the base 24.

Each trace support 40 of the third plurality of trace supports 40 comprises a tapering portion 58 individually interconnecting the wide portion 46 and the narrow portion 48 of the trace support 40. The tapering portion 58 defines a narrowing width when going from the wide portion 46 to the narrow portion 48. Each second intermediate surface 56 interconnects a pair of neighbouring trace supports 40 of the plurality of trace supports 40 at their respective tapering portions 58.

The first top surface 26 comprises third intermediate surfaces 60. Each third intermediate surface 60 individually interconnects a pair of neighbouring contact pad supports 34 of the second plurality of contact pad supports 34, and the third intermediate surfaces 60 are provided on the first level.

Each trace support 40 of the third plurality of trace supports 40 defines a first trace support undercut 62 provided at the wide portion 46 and at the trace support boundary 42. The first trace support undercut 62 and partly undercuts the trace supports area 44 at the wide portion 46 of the trace support 40.

Each trace support 40 of the third plurality of trace supports 40 defines a second trace support undercut (similar to 94) provided at the narrow portion 48 and at the trace support boundary (similar to 88). The second trace support undercut (similar to 94) and partly undercuts the trace supports area (similar to 90) at the narrow portion 48 of the trace support 40.

Each contact pad support 34 of the second plurality of contact pad supports 34 defines a contact pad support undercut (similar to 62) provided at the contact pad support boundary 36 and partly undercuts the contact pad support area 38 of the contact pad support 34. The first trace support undercut 62 and the contact pad support undercut (similar to 62) have approximately the same undercutting depth.

The trace support area (similar to 90) is convex at the narrow portions 48 of each trace support 40 of the third plurality of trace supports 40.

The probe tip 30 has a tip base 68 having a proximal end 82 and a distal end 84 and constituting a plate-like tip structure defining a second top surface 70, a second bottom surface 72, and a second rim 74 interconnecting the second top surface 70 and the second bottom surface 72. The second top surface 70 connects to the second rim 74 along a first side edge 76 extending from the proximal end 82 to the distal end 84, a second side edge 78 on the opposite side of the tip structure relative to the first side edge 76 and extending from the proximal end 82 to the distal end 84, and a front edge 80 interconnecting the first side edge 76 and the second side edge 78. The tip base 68 is connected at its proximal end 82 to the base 24.

The probe tip 30 has a sixth plurality of contact electrode supports 86 provided on the second top surface 70 and supported by the tip base 68. Each contact electrode support 86 is elongated and extends from the proximal end 82 in a direction towards the distal end 84. Each contact electrode support 86 further has an outline defining a contact electrode support boundary 88 enclosing a contact electrode support area 90.

Each contact electrode 32 of the first plurality of contact electrodes 32 is individually supported by a contact electrode support 86 of the sixth plurality of contact electrode supports 86 and is constituted by a metallic electrode layer 108 covering the contact electrode support area 90 of the supporting contact electrode support 86.

The first plurality and the sixth plurality are equal in numbers. The second top surface 70 comprises fourth intermediate surfaces 92. Each fourth intermediate surface 92 individually interconnects a pair of neighbouring contact electrode supports 86 of the sixth plurality of contact electrode supports 86. The fourth intermediate surfaces 92 is provided on a fourth level. The contact electrode support areas 90 is provided on a fifth level above the fourth level relative to the tip base 68. The fourth level is the same as the second level and the fifth level is the same as the third level.

The front edge 80 is straight and the sixth plurality of electrode supports 86 extends to and terminates at the front edge 80.

Each contact electrode support 86 of the sixth plurality of contact electrode supports 86 defines a contact electrode support undercut 94 provided at the contact electrode support boundary 88 and partly undercutting the contact electrode support area 90 of the contact electrode support 86. The contact electrode support area 90 is convex.

FIG. 10A shows the multipoint probe 18 mounted in a test apparatus 20 holding a test sample 22. The multipoint probe 18 is oriented so that its first top surface 26 is facing the test sample 22 and its first bottom surface 28 is facing away from the test sample 22.

FIG. 10B shows a front view of the probe tip 30 in a contacting with a test sample 22. The convexity of contact electrode support area 90 also makes the contact electrode 32 convex, since the latter was provided by depositing a metal film 108 on the former. This means that when used, the centre of the contact electrode 32 is more likely to make contact with the test sample, as is shown in FIG. 10B. This increases the accuracy and precision of the measurements, in particular if the surface of the test sample 22 is uneven or has small imprinted structures.

FIG. 10C shows a sectional side view of the probe tip 30 having a tip base 68 with a second top surface 70 and a second bottom surface 72. The contact electrode support 86 terminate at the front edge 80. With the orientation shown in FIG. 10A, this has the effect that there is no risk that the front edge 80 will contact the test sample before the contact electrode 32 on the contact electrode support 86.

Similarly, FIG. 10D shows a sectional side view of the probe tip 30 having a tip base 68 with a second top surface 70 and a second bottom surface 72. The contact electrode support 86 terminates at a distance from the front edge 80. The positioning of the contact electrode 32 on the contact electrode support 86 has the effect that the risk of the front edge 80 contacting the test sample before the contact electrode 32 is reduced, compared to a positioning of the contact electrode 32 closer to or on the second top surface 70.

FIG. 11A illustrates an alternative embodiment of the probe tip 30. The front edge 80 and the tip base 68 are divided into a first and a second front edge portion and a first and a second tip base portions, respectively, by a slit 110 extending from the distal end 84 to the proximal end 82. The slit 110 is provided between a pair of neighbouring contact electrodes 32 of the first plurality of contact electrodes 32.

FIG. 11B illustrates another alternative embodiment of the probe tip 30. The front edge is cut into three portions by two slits extending in a direction from the distal end 84 to the proximal end 82. Each of the two slits 110 is provided between a pair of neighbouring contact electrodes 32 of the first plurality of contact electrodes 32. The two slits terminated approximately halfway between the distal end 84 and the proximal end 82.

FIG. 11C illustrates an alternative embodiment in which four of the traces 52 are connected to a strain-gauge 112 contact detector as described in EP2132578 (A1). The remaining traces are connected to contact electrodes 32 on a probe tip 30 similar to as described above. Alternative embodiments are contemplated in which the electrodes of probe tip 30 are directed to a different purpose, for example constituting a part of a remote sensing circuitry known in the art. Alternative embodiments are also contemplated in which the probe tip 30 as a whole is replaced with another structure, for example a remote sensing circuitry.

ITEM LIST 10 wafer
12 bottom layer
14 intermediate layer
16 top layer
18 multipoint probe
20 test apparatus
22 test sample
24 base
25 first rim
26 first top surface
28 first bottom surface
30 probe tip
32 contact electrode
34 contact pad support
36 contact pad support boundary
38 contact pad support area
40 trace supports
42 trace support boundary
44 trace support area
46 wide portion
48 narrow portion
50 contact pads 52 traces
54 first intermediate surface
56 second intermediate surface
58 tapering portion
60 third intermediate surface
62 first trace support undercut
64 second trace support undercut
66 concrete pad support undercut
68 tip base
70 second top surface
72 second bottom surface
74 second rim
76 first side edge
78 second side edge
80 front edge
82 proximal end
84 distal end
86 contact electrode support
88 contact electrode support boundary
90 contact electrode support area
92 fourth intermediate surfaces
94 contact electrode support undercut
100 first mask
102 second mask
104 third mask
106 protective film
108 metallic film
110 slit
112 strain gauge

The invention claimed is:

1. A multipoint probe for establishing an electrical connection between a test apparatus and a test sample, said multipoint probe comprising:
a base comprising a plate-like structure defining a top surface, a bottom surface, and a circumferential rim interconnecting said top surface and first bottom surface;
a probe tip at said top surface of said base and freely extending from said circumferential rim, said probe tip comprising a plurality of contact electrodes configured for contacting and establishing an electrical connection to said test sample;
a plurality of contact pad supports on said top surface and supported by said base, each contact pad support having an outline defining a contact pad support boundary enclosing a contact pad support area;
a plurality of trace supports on said top surface and supported by said base, each trace support having an outline defining a trace support boundary enclosing a trace support area, and each trace support comprising a wide portion connected to one of said plurality of contact pad supports and individually defining a first length and a first width and a narrow portion connected to said probe tip and individually defining a second length and a second width, said first length being longer than said second length and said first width being greater than said second width;
a plurality of contact pads configured for connecting to said test apparatus, each contact pad being individually supported by one of said plurality of contact pad supports, and each contact pad comprising a metallic layer covering said contact pad support area of said supporting contact pad support;
a plurality of traces, each trace being individually supported by one of said plurality of trace supports, and each trace comprising a metallic layer covering said trace support area of said supporting trace support, each trace individually interconnecting one of said plurality of contact pads and one of said plurality of contact electrodes;
said contact electrodes, said contact pad supports, said trace supports, said contact pads, and said traces being equal in numbers;
said first top surface comprising first intermediate surfaces, each first intermediate surface individually interconnecting a pair of neighboring trace supports of said plurality of trace supports at their respective wide portions;
said first top surface comprising second intermediate surfaces, each second intermediate surface individually interconnecting a pair of neighboring trace supports of said plurality of trace supports at their respective narrow portions; and
said first intermediate surfaces being provided on a first level, said second intermediate surfaces being provided on a second level above said first level relative to said base, and said contact pad support areas and said trace support areas being provided on a third level above said first level and said second level relative to said base.

2. The multipoint probe according to claim 1, wherein said first level and said second level are spaced apart by a first distance, and said second level and said third level are spaced apart by a second distance, wherein said first distance is greater than said second distance.

3. The multipoint probe according to claim 1, wherein said first level defines a first plane, said second level defines a second plane parallel to said first plane, and said third level defines a third plane parallel to said second plane.

4. The multipoint probe according to claim 1, wherein each trace support of said plurality of trace supports comprises a tapering portion individually interconnecting said wide portion and said narrow portion of said trace support, said tapering portion defining a narrowing width when going from said wide portion to said narrow portion, wherein each second intermediate surface interconnects a pair of neighboring trace supports of said plurality of trace supports at their respective tapering portions.

5. The multipoint probe according to claim 1, wherein said top surface comprises third intermediate surfaces, each third intermediate surface individually interconnecting a pair of neighboring contact pad supports of said plurality of contact pad supports, wherein said third intermediate surfaces are on said first level, wherein each trace support of said plurality of trace supports defines a first trace support undercut at said wide portion and at said trace support boundary and partly undercutting said trace support area at said wide portion of said trace support, wherein said first trace support undercut defines a first undercutting depth, wherein each trace support of said plurality of trace supports defines a second trace support undercut at said narrow portion and at said trace support boundary and partly undercutting said trace support area at said narrow portion of said trace support, wherein said second trace support undercut defines a second undercutting depth, and wherein said first undercutting depth is deeper than said second undercutting depth.

6. The multipoint probe according to claim 1, wherein each contact pad support of said plurality of contact pad supports defines a contact pad support undercut provided at said contact pad support boundary and partly undercutting said contact pad support area of said contact pad support, wherein said first trace support undercut and said contact pad support undercut have approximately the same undercutting depth, and wherein said trace support area is convex at said narrow portions of each trace support of third plurality of trace supports.

7. The multipoint probe according to claim 1, wherein said probe tip comprises:
   a tip base having a proximal end and a distal end and constituting a plate-like tip structure defining a second top surface, a second bottom surface, and a second rim interconnecting said second top surface and said second bottom surface, said second top surface connecting to said second rim along a first side edge extending from said proximal end to said distal end, a second side edge on the opposite side of said tip structure relative to said first side edge and extending from said proximal end to said distal end, and a front edge interconnecting said first side edge and said second side edge, said tip base being connected at its proximal end to said base; and
   a plurality of contact electrode supports provided on said second top surface and supported by said tip base, each of said contact electrode supports being elongated and extending from said proximal end in a direction towards said distal end, and each of said contact electrode supports having an outline defining a contact electrode support boundary enclosing a contact electrode support area;
   each contact electrode of said plurality of contact electrodes being individually supported by one of said plurality of contact electrode supports and comprising a metallic electrode layer covering said contact electrode support area of said supporting contact electrode support;
   said contract electrodes and said contact electrode supports being equal in number;
   said second top surface comprising fourth intermediate surfaces, each fourth intermediate surface individually interconnecting a pair of neighboring contact electrode supports of said plurality of contact electrode supports;
   said fourth intermediate surfaces being on a fourth level, said contact electrode support areas being on a fifth level above said fourth level relative to said tip base, said fourth level being the same as said second level and said fifth level being the same as said third level.

8. The multipoint probe according to claim 7, wherein said front edge is straight, and wherein said plurality of electrode supports extends to and terminates at said front edge.

9. The multipoint probe according to claim 7, wherein said plurality of electrode supports extends to and terminates at a third distance from said front edge; wherein said third distance is a range of 0.1 μm to 2 μm;
   wherein each contact electrode support of said plurality of contact electrode supports defines a contact electrode support undercut at said contact electrode support boundary and partly undercutting said contact electrode support area of said contact electrode support;
   wherein said contact electrode support undercut defines a third undercutting depth smaller than 100 nm;
   wherein said second trace support undercut and said contact electrode undercut have approximately the same undercutting depth; and
   wherein said contact electrode support area is convex.

* * * * *